(12) United States Patent
Lin (10) Patent No.: US 12,429,930 B2
(45) Date of Patent: Sep. 30, 2025

(54) CABINET FOR MOUNTING EXPANSION CARD AND SERVER

(71) Applicant: Fulian Precision Electronics (Tianjin) Co., LTD., Tianjin (CN)

(72) Inventor: Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 155 days.

(21) Appl. No.: 18/414,613

(22) Filed: Jan. 17, 2024

(65) Prior Publication Data

US 2024/0361814 A1 Oct. 31, 2024

(30) Foreign Application Priority Data

Apr. 27, 2023 (CN) .......................... 202310474303.6

(51) Int. Cl.
*G06F 1/18* (2006.01)
*H05K 7/14* (2006.01)

(52) U.S. Cl.
CPC ........... *G06F 1/185* (2013.01); *H05K 7/1488* (2013.01)

(58) Field of Classification Search
CPC .... H05K 7/1488; H05K 7/1489; G06F 1/185; G06F 1/186
See application file for complete search history.

(56) References Cited

U.S. PATENT DOCUMENTS

| | | | | |
|---|---|---|---|---|
| 3,735,989 A * | 5/1973 | Dattilo | ................. | G11B 23/107 360/93 |
| 5,208,735 A * | 5/1993 | Twachtmann | ....... | H05K 7/1411 403/18 |
| 5,332,306 A * | 7/1994 | Babb | ..................... | H05K 7/1418 439/377 |
| 6,173,843 B1 * | 1/2001 | Christensen | ............ | G06F 1/184 361/801 |
| 7,661,778 B2 * | 2/2010 | Yang | ..................... | A47B 88/427 312/334.1 |
| 10,563,429 B1 * | 2/2020 | Bailey | ................... | E05B 35/008 |
| 12,295,114 B2 * | 5/2025 | Lin | ...................... | H05K 7/1489 |
| 2015/0146372 A1 * | 5/2015 | French, Jr. | ........... | H05K 7/1489 29/854 |
| 2024/0407124 A1 * | 12/2024 | Lin | ...................... | H05K 7/1489 |
| 2025/0024627 A1 * | 1/2025 | Lin | ...................... | H05K 7/1461 |

FOREIGN PATENT DOCUMENTS

| | | |
|---|---|---|
| CN | 214623549 | 11/2021 |
| TW | I762341 | 4/2022 |

* cited by examiner

*Primary Examiner* — Adrian S Wilson
(74) *Attorney, Agent, or Firm* — ScienBiziP, P.C.

(57) ABSTRACT

A cabinet for mounting expansion card comprises a base and a positioning module. The base defines a cavity. The expansion card is slidable into the cavity in a first direction. The positioning module comprises a positioning piece. The positioning piece is movably connected to the base in a second direction, and the second direction is substantially perpendicular to the first direction. The positioning piece comprises a latching part placed in the cavity. The expansion card defines a slot. The latching part comprises a bevel. When the expansion card slides into the cavity, the expansion card pushes the bevel to lift the latching part, and the latching part inserts into the slot to latch the expansion card when the slot is aligned with the latching part; when the latching part is pulled out from the slot, the latching part unlatches the expansion card. A server with the cabinet is also disclosed.

20 Claims, 13 Drawing Sheets

CABINET FOR MOUNTING EXPANSION CARD AND SERVER

FIELD

The disclosure herein generally relates to information handling systems, and more particularly relates to a cabinet for mounting expansion card and a server.

BACKGROUND

When inserting an expansion card into a server, usually, a user needs to open the cabinet of the server to fix and lock the expansion card, to prevent the expansion card from shaking. However, opening the cabinet may be inconvenient and affects the assembly efficiency of the server.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 1:
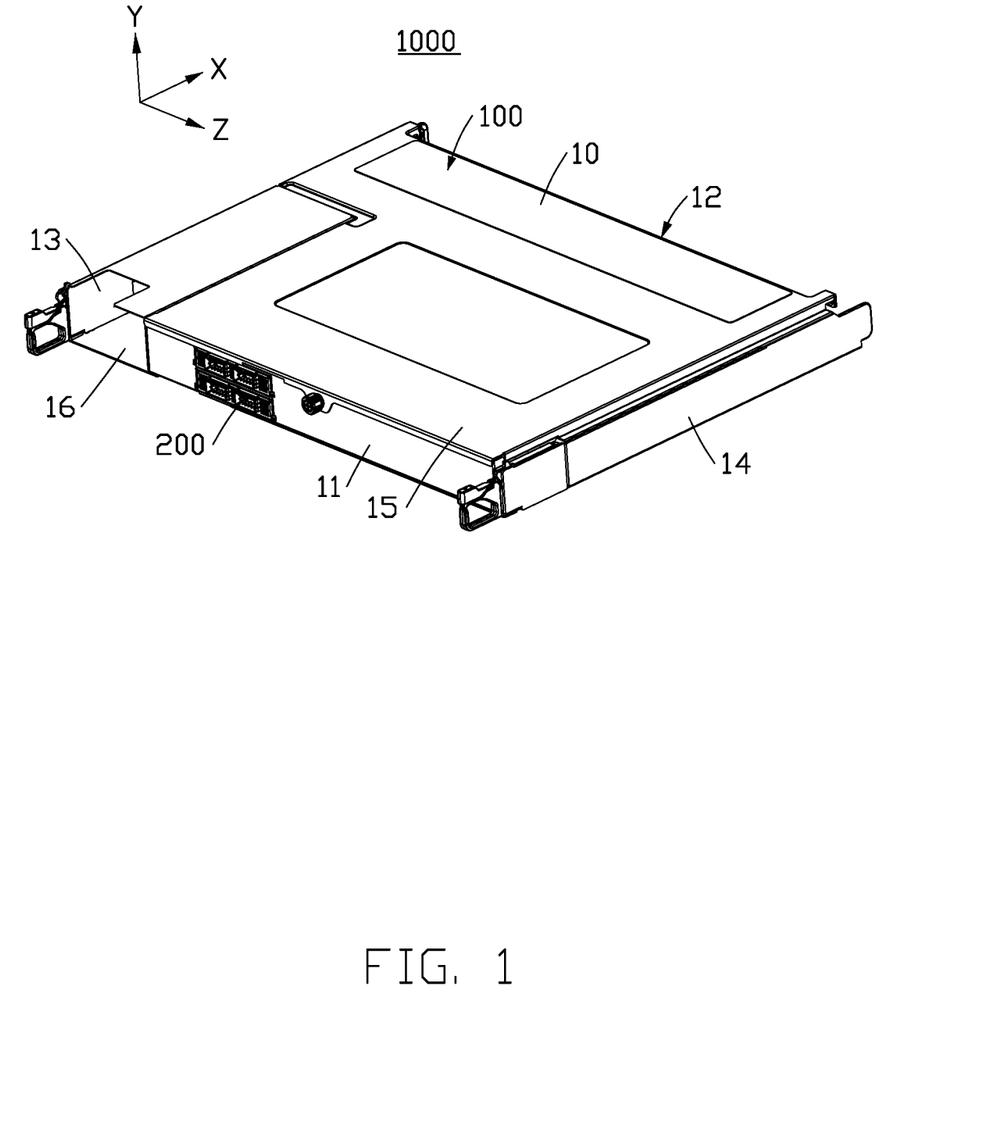
FIG. 1 is an isometric view illustrating a server according to an embodiment of the present disclosure.
Figure 2:
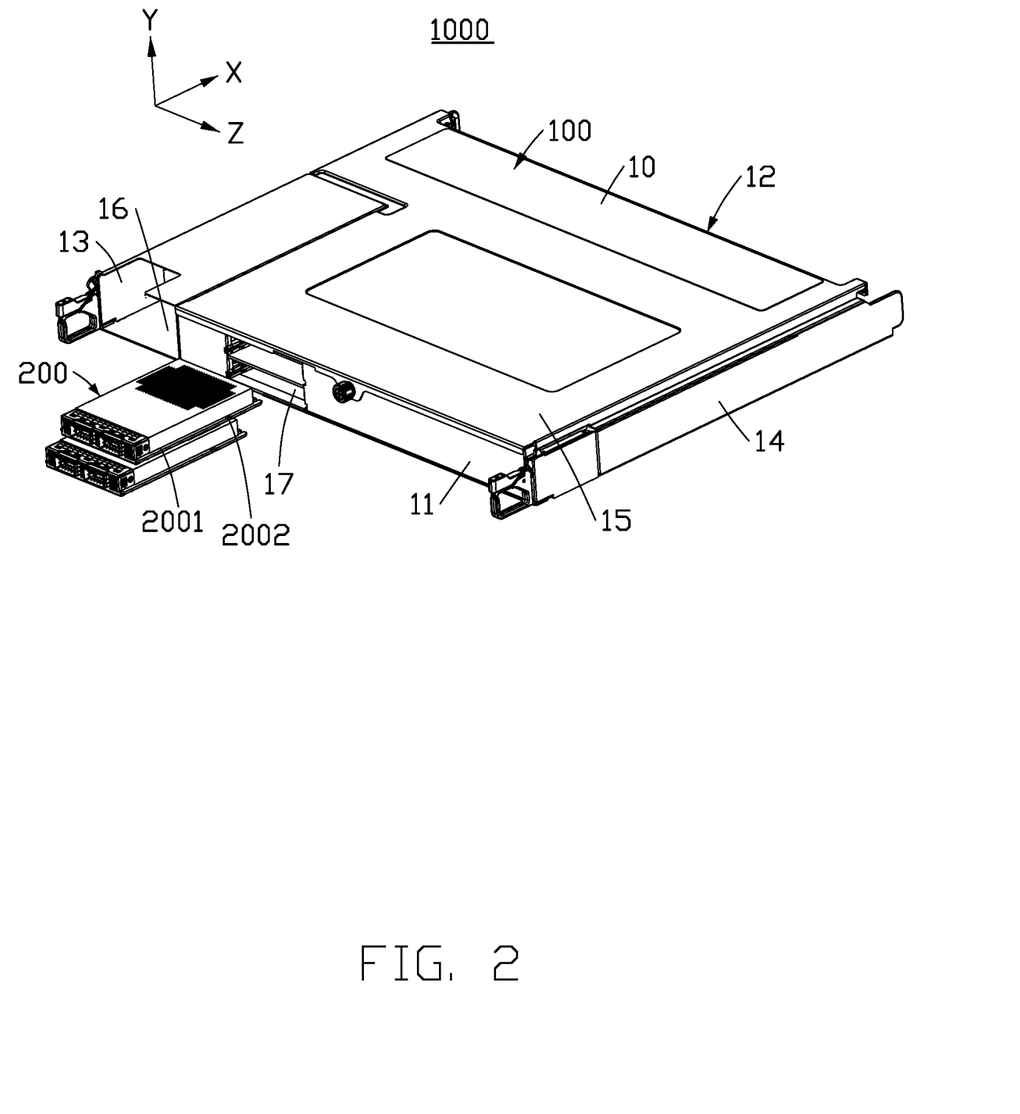
FIG. 2 is an isometric view illustrating the server in FIG. 1 when an expansion card in not inserted into the server.
Figure 3:
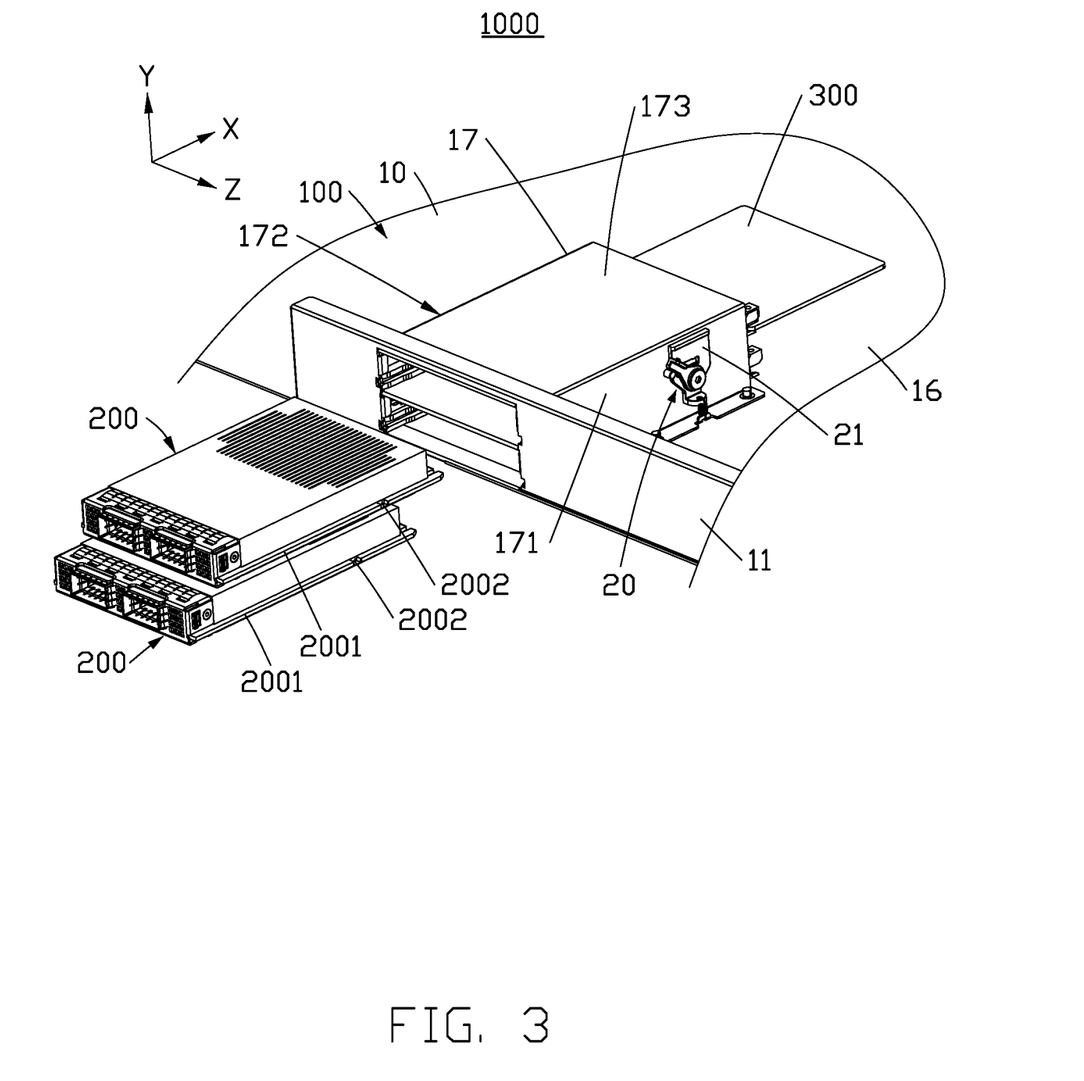
FIG. 3 is another isometric view illustrating the server in FIG. 2 when the expansion card in not inserted into the server.
Figure 4:
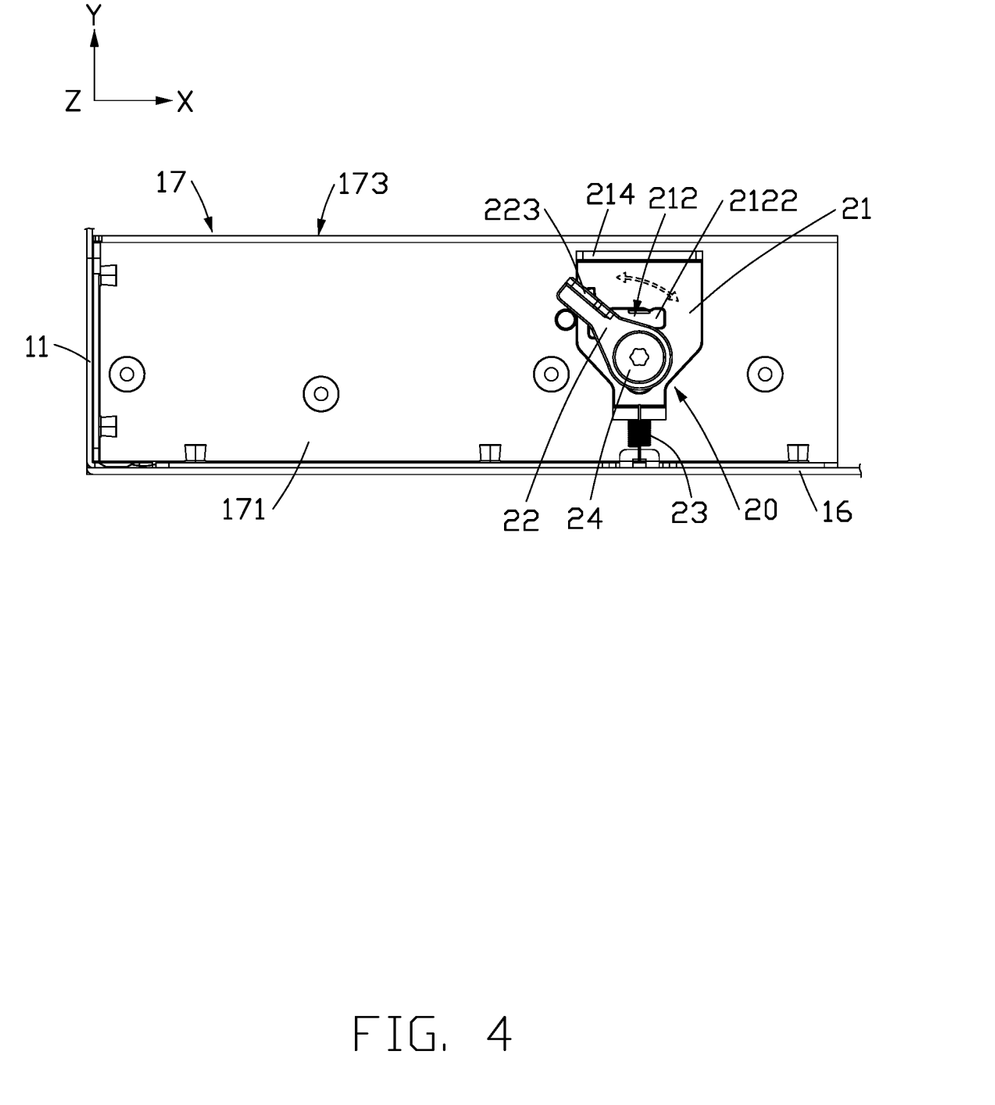
FIG. 4 is a side view illustrating the server in FIG. 3 when a positioning module is in a locked state.

As shown in FIG. 1 to FIG. 3, a server 1000 in an embodiment includes a cabinet 100 and at least one expansion card 200. The cabinet 100 in an embodiment includes a base 10 and a positioning module 20. The base 10 forms a cavity 17, and the expansion card 200 is slidable into the cavity 17. The positioning module 20 is connected to the base 10.

The expansion card 200 is slidable in a first direction X. When the expansion card 200 slides in the first direction X into the cavity 17, the positioning module 20 automatically locks the expansion card 200 in the cavity 17, which improves the seismic performance of the server 1000 and improves the assembly efficiency of the server 1000.

The positioning module 20 can also unlock the expansion card 200, so that the expansion card 200 can be taken out from the cabinet 100 in the opposite direction of the first direction X, which facilitates maintenance or replacement of the expansion card 200.

In some embodiments, the server 1000 also includes a circuit board 300. The circuit board 300 is located on the cabinet 100. The expansion card 200 and the circuit board 300 are arranged along the first direction X. The expansion card 200 and the circuit board 300 are electrically connected.

In some embodiments, when the expansion card 200 moves to the pre-set position in the cavity 17, one end of the expansion card 200 is automatically and electrically connected to the circuit board 300, which improves the assembly efficiency of the server 1000.

In some embodiments, the server 1000 also includes a connector 400. The connector 400 is connected to the circuit board 300. When the expansion card 200 moves to the pre-set position in the cavity 17, the expansion card 200 is electrically connected to the connector 400, so to connect to the circuit board 300, which improves the stability and reliability of the connection between the expansion card 200 and the circuit board 300.

In some embodiments, the base 10 includes a front wall 11, a back wall 12, a left wall 13, a right wall 14, a top wall 15 and a bottom wall 16. The front wall 11 and the back wall 12 are arranged along the first direction X. The top wall 15

和 bottom wall 16 are arranged along the second direction Y. The left wall 13 和 right wall 14 are arranged along a third direction Z. The second direction Y is perpendicular to the first direction X, and the third direction Z is perpendicular to the first direction X and the second direction Y.

In some embodiments, the cavity 17 is connected to the front wall 11, the opening of the cavity 17 is exposed on the front wall 11, and the expansion card 200 enters the cavity 17 through the front wall 11.

As shown in FIG. 3 to FIG. 7, in some embodiments, the base 10 forms a first wall 171, a second wall 172, and a third wall 173 around the cavity 17. The first wall 171 and the second wall 172 are arranged along the third direction Z, the third wall 173 is located between the top wall 15 and the bottom wall 16, the third wall 173 connects the first wall 171 and the second wall 172. The first wall 171 and the second wall 172 are both connected to the bottom wall 16. The first wall 171, the second wall 172, the third wall 173, and the bottom wall 16 form a space capable of accommodating the expansion card 200.

In some embodiments, the positioning module 20 is located on the first wall 171.

The positioning module 20 includes a positioning piece 21. The positioning piece 21 is movably connected to the first wall 171, and the positioning piece 21 can move relative to the first wall 171 along the second direction Y and the opposite direction of the second direction Y. The positioning piece 21 includes a latching part 211. A part of the positioning piece 21 is placed outside the cavity 17. The latching part 211 extends into the cavity 17 through the first wall 171.

The expansion card 200 includes a side rib 2001, and the side rib 2001 is located at the end of the expansion card 200 along the third direction Z. When the expansion card 200 is placed in the cavity 17, the side rib 2001 connects the first wall 171 and the second wall 172, so that the first wall 171 and the second wall 172 support the expansion card 200. side rib 2001 is provided with a slot 2002, and the slot 2002 runs through the side rib 2001 along the second direction Y.

When the expansion card 200 is located at a pre-set position in the cavity 17, the latching part 211 can move in the opposite direction of the second direction Y to plug into the slot 2002. At this time, the positioning module 20 is in a locked state, and the latching part 211 limits the movement of the expansion card 200 in the opposite direction of the first direction X and the opposite direction of the first direction X.

When the positioning module 20 locks the expansion card 200 at the cavity 17, the latching part 211 can move along the second direction Y to separate from the slot 2002. At this time, the positioning module 20 is in an unlocked state, and the expansion card 200 can move relative to the cavity 17 in the opposite direction of the first direction X to be taken out from the cavity 17.

The latching part 211 has a bevel 2111, when the expansion card 200 slides into the cavity 17 along the first direction X, an end of the side rib 2001 along the first direction X can contact the bevel 2111, and drives the positioning piece 21 to move along the second direction Y. Then, the latching part 211 moves above the side rib 2001, the expansion card 200 continues to move along the first direction X, and the latching part 211 slides relative to the upper surface of the side rib 2001. When the slot 2002 moves to a position below the latching part 211, the latching part 211 can move in the opposite direction of the second direction Y and automatically connect with the slot 2002, improving the efficiency of the connection between the expansion card 200 and the cabinet 100 and improving the assembly efficiency of server 1000.

In some embodiments, the bevel 2111 faces the opposite direction of the first direction X, and the bevel 2111 also faces the opposite direction of the second direction Y. This makes it easier for the end of the side rib 2001 to contact the bevel 2111 during the expansion card 200 inserting into the cavity 17 along the first direction X, improving assembly efficiency.

As shown in FIG. 5, FIG. 7, FIG. 8, and FIG. 9, in some embodiments, latching part 211 extends in the opposite direction of the second direction Y. When the expansion card 200 is located at a pre-set position in the cavity 17, the slot 2002 and the latching part 211 are arranged along the second direction Y, and the positioning piece 21 can move in the opposite direction of the second direction Y, so that the latching part 211 is insertable into the slot 2002, to limit the movement of the expansion card 200 along the first direction X and the opposite direction of the first direction X. At this time, the positioning module 20 is in the locked state, and the expansion card 200 is fixed in the cavity 17.

In some embodiments, when the positioning module 20 is in the locked state, the positioning piece 21 is moved along the second direction Y, and the latching part 211 can move away from the slot 2002 along the second direction Y, thereby being separated from the slot 2002, so that the positioning module 20 switches from the locked state to the unlocked state.

In some embodiments, the positioning piece 21 includes a plurality of latching parts 211 arranged along the second direction Y, and each latching part 211 extends along the opposite direction of the second direction Y. Multiple expansion cards 200 can be inserted into the cabinet 100, and the multiple expansion cards 200 are arranged in the cabinet 100 along the second direction Y. One positioning piece 21 can lock multiple expansion cards 200 at the same time, improving assembly efficiency.

In some embodiments, multiple latching parts 211 are arranged along the first direction X (not shown in the figures). Multiple slots 2002 are set up on a same expansion card 200. When the expansion card 200 is inserted into cavity 17, multiple latching parts 211 are inserted into different slots 2002 respectively, which can improve the stability and reliability of the expansion card 200 and the cabinet 100 and improve the seismic performance of the server 1000.

As shown in FIG. 4, FIG. 5, and FIG. 8 to FIG. 10, in some embodiments, the positioning module 20 also includes an elastic piece 23. The elastic piece 23 connects the positioning piece 21 and the bottom wall 16. The elastic piece 23 is used to drive the positioning piece 21 to move in the opposite direction of the second direction Y. When the slot 2002 moves below the latching part 211, the latching part 211 can move in the opposite direction of second direction Y to insert the slot 2002.

Moreover, after the latching part 211 and the slot 2002 are connected, the elastic piece 23 can also provide continuous force to improve the stability and reliability of the latching part 211 and the slot 2002, reducing the risk of separation of latching part 211 and slot 2002 due to shaking.

In some embodiments, the elastic piece 23 is a tension spring. One end of the tension spring is connected to the lower end of the bottom wall 16 or the first wall 171, and the other end of the tension spring is connected to the positioning piece 21. The tension spring can provide a force in the opposite direction of the second direction Y to the positioning piece 21, so that the positioning piece 21 moves toward the bottom wall 16. Furthermore, the lower end of the first wall 171 is the end of the first wall 171 close to the bottom wall 16.

In some embodiments, the elastic piece 23 is a compression spring (not shown in the figures). One end of the compression spring is connected to the upper end of the top wall 15 or the first wall 171, and the other end of the compression spring is connected to the positioning piece 21. The compression spring can provide a force in the opposite direction of the second direction Y to the positioning piece 21, so that the positioning piece 21 moves toward the bottom wall 16. Furthermore, the upper end of the first wall 171 is the end of the first wall 171 close to the top wall 15.

In some embodiments, positioning piece 21 also has a second groove 213. The second groove 213 is extended along the second direction Y. The positioning module 20 also includes a fixing piece 24. A part of the fixing piece 24 passes through the second groove 213 and connects to the first wall 171. The second groove 213 and the fixing piece 24 can guide the positioning piece 21 to move along the second direction Y and the opposite direction of the second direction Y. it is also helpful to switch the positioning module 20 between the locked state and the unlocked state, and it is also helpful to limit the movement of the positioning piece 21 along the first direction X and the third direction Z, reducing the shaking of the positioning piece 21.

In some embodiments, the fixing piece 24 is screw threaded to the first wall 171 for easy assembly.

In some embodiments, positioning module 20 also includes a nut 25. The nut 25 is located on the first wall 171. A part of the fixing piece 24 passes through the second groove 213 and then screw threaded to the connecting nut 25, which simplifies the processing of the base 10, reduces the thickness of the base 10, and reduces the weight and production cost of the base 10.

Figure 8:
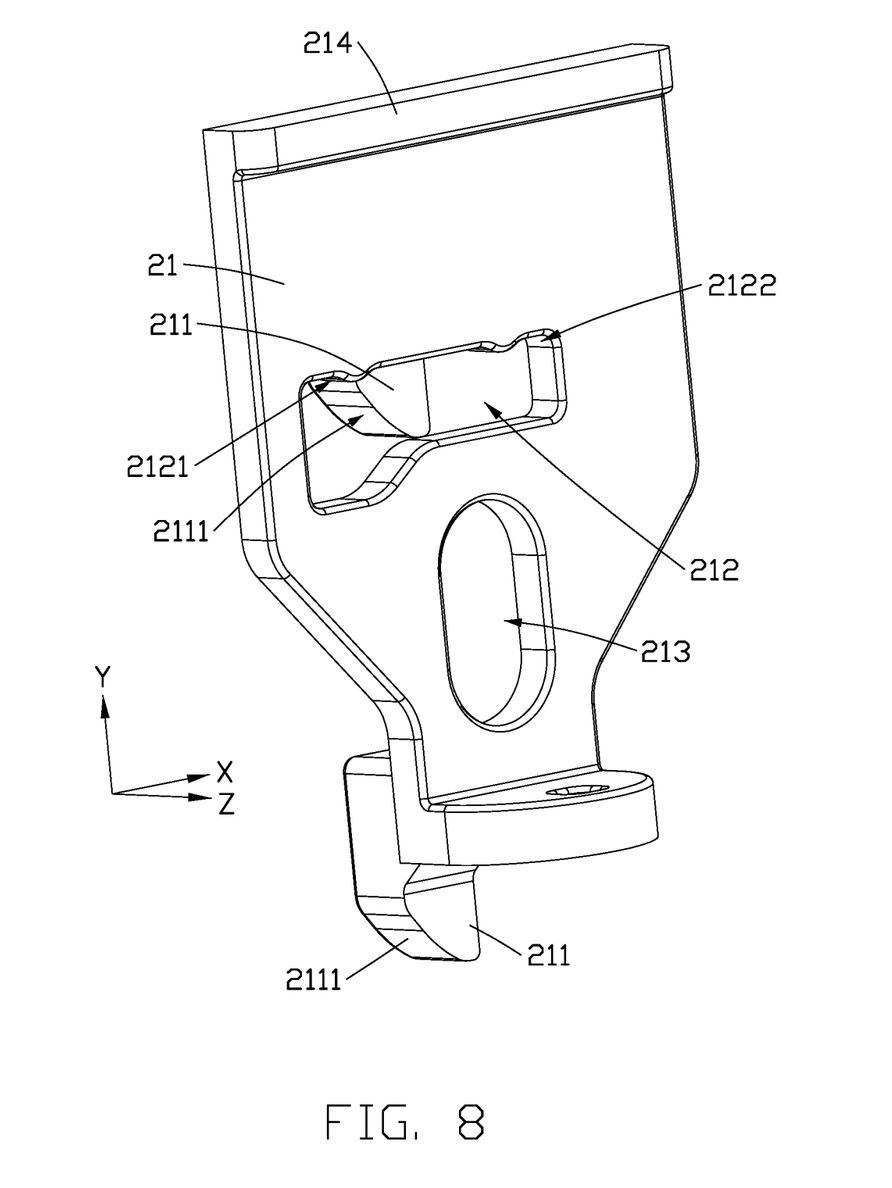
FIG. 8 is an isometric view illustrating a positioning piece according to an embodiment of the present disclosure.
Figure 9:
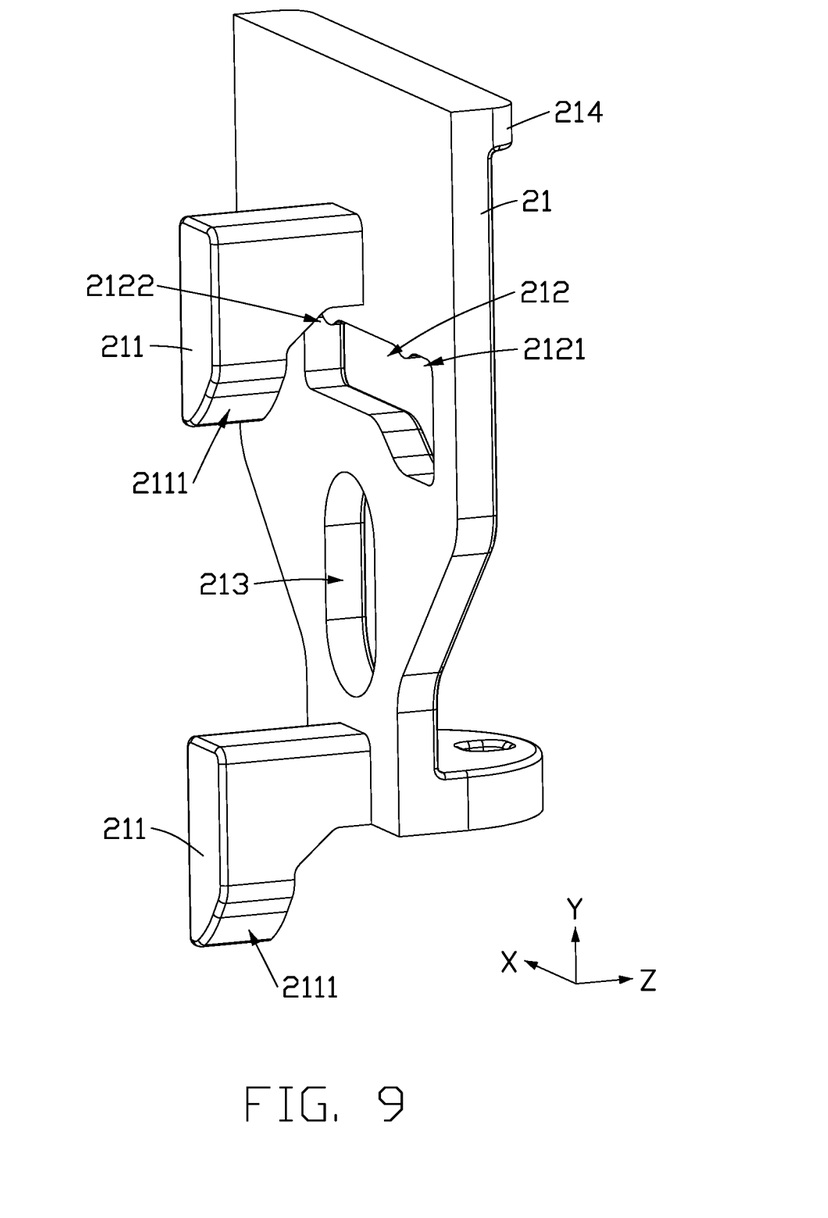
FIG. 9 is another isometric view illustrating the positioning piece in FIG. 8.
Figure 10:
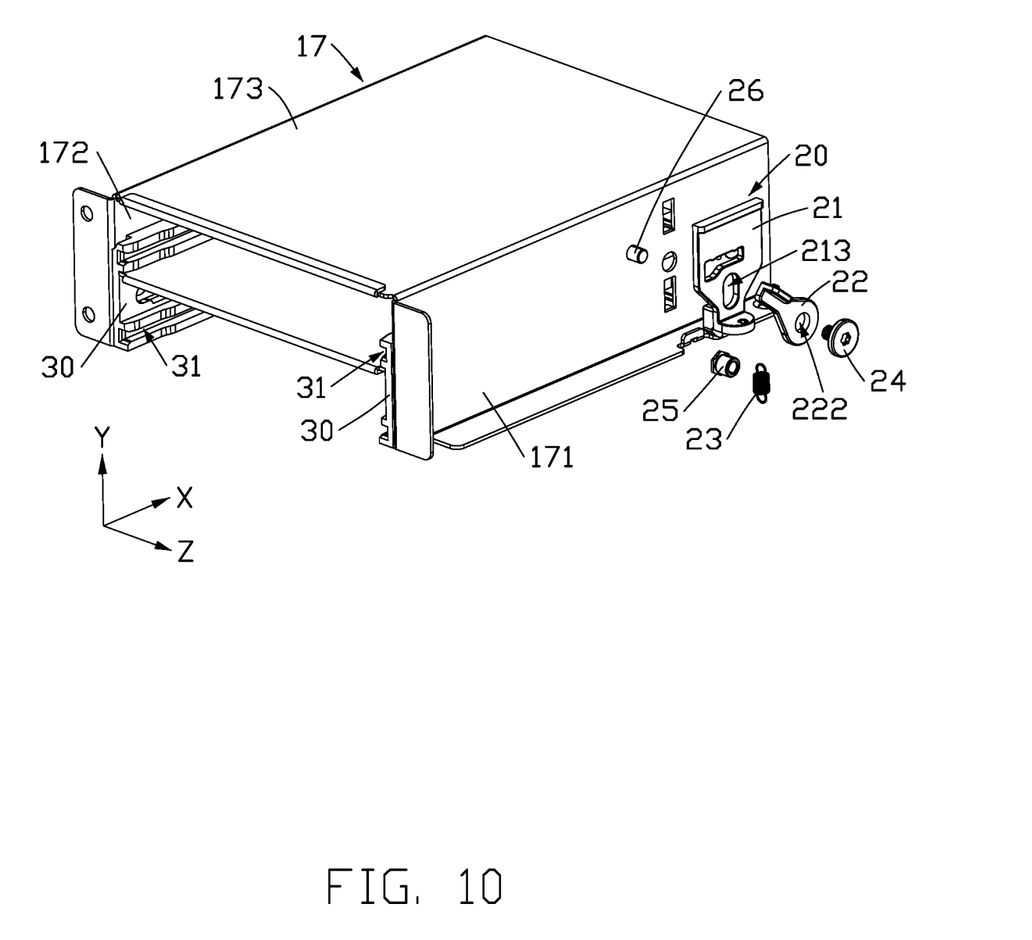
FIG. 10 is an exploded view illustrating the server in FIG. 3.

In some embodiments, positioning piece 21 also includes a second handle 214. User can move the latching part 211 along the second direction Y by the second handle 214, so that the latching part 211 moves along the second direction Y for unlocking. The second handle 214 facilitates the user to lift the positioning piece 21 along the second direction Y, to separate the latching part 211 from the slot 2002.

In some embodiments, the second handle 214 is located at the end of the positioning piece 21 along the second direction Y, making it convenient for the user to hold the second handle 214.

As shown in FIG. 4-12, in some embodiments, positioning piece 21 has a first sliding groove 212. The positioning module 20 includes an unlocking piece 22. The unlocking piece 22 is rotatably connected to the first wall 171. The unlocking piece 22 is rotatable from a first position to a second position. When the unlocking piece 22 is rotated to the first position, the latching part 211 latches the expansion card 200. When the unlocking piece 22 is rotated to the second position, the latching part 211 unlatches the expansion card 200. The unlocking piece 22 has a convex part 221, and a part of the convex part 221 in placed in the first sliding groove 212.

When the unlocking piece 22 is rotated, the convex part 221 moves relative to the positioning piece 21 along the first sliding groove 212. The convex part 221 contacts the unlocking piece 22 and makes the unlocking piece 22 move along the second direction Y, to switch the positioning module 20 from the locked state to the unlocked state, improving the efficiency of unlocking the expansion card 200.

In some embodiments, the first sliding groove 212 has a first end 2121 and a second end 2122. When the positioning module 20 is in the locked state, the convex part 221 is located at the first end 2121. When the positioning module 20 is in the unlocked state, the convex part 221 is located at the second end 2122.

Along the second direction Y, the distance between the second end 2122 and the rotation axis of the unlocking piece 22 is greater than the distance between the first end 2121 and the rotation axis of the unlocking piece 22. The distance between the convex part 221 at the second end 2122 and the rotation axis of the unlocking piece 22 is greater than the distance between the convex part 221 at the first end 2121 and the rotation axis of the unlocking piece 22. When the convex part 221 moves from the first end 2121 to the second end 2122, the positioning piece 21 can be moved along the second direction Y away from the rotation axis of the unlocking piece 22, that is, the positioning piece 21 moves up along the second direction Y, so the latching part 211 can be separated from the slot 2002, thereby unlocking the expansion card 200.

In some embodiments, the positioning module 20 further includes a stopping piece 26, and the stopping piece 26 is located on the first wall 171. After the convex part 221 moves from the second end 2122 to the first end 2121, the stopping piece 26 contacts the convex part 221 and restricts the rotation of the convex part 221, reducing the impact of continued rotation of the convex part 221 on the positioning piece 21.

In some embodiments, the stopping piece 26 is connected to the first wall 171 by welding, which improves the stability and reliability of the stopping piece 26 connecting to the first wall 171.

Figure 11:
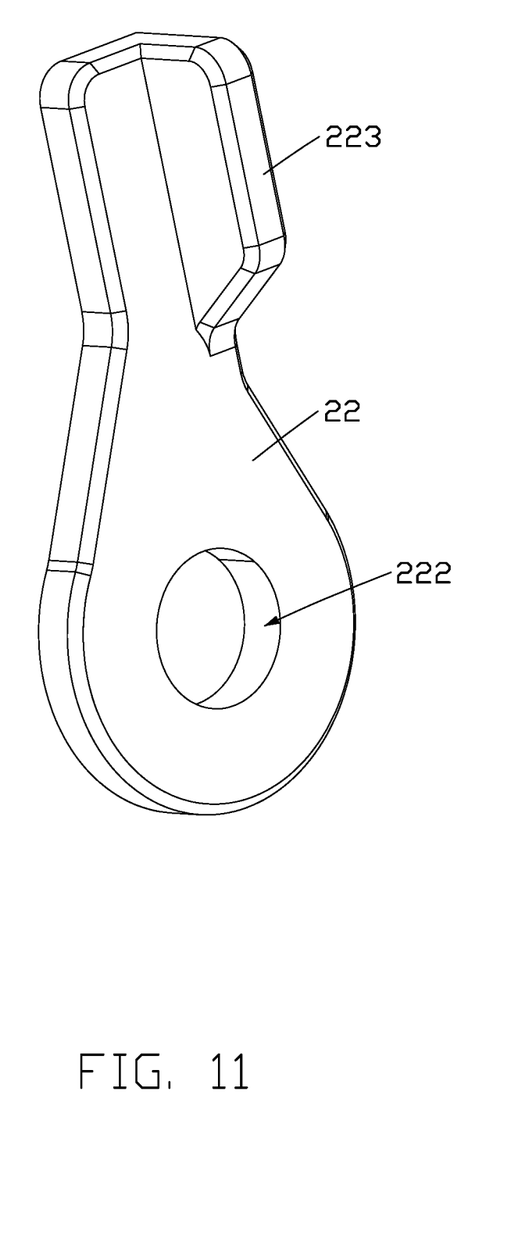
FIG. 11 is an isometric view illustrating an unlocking piece according to an embodiment of the present disclosure.
Figure 12:
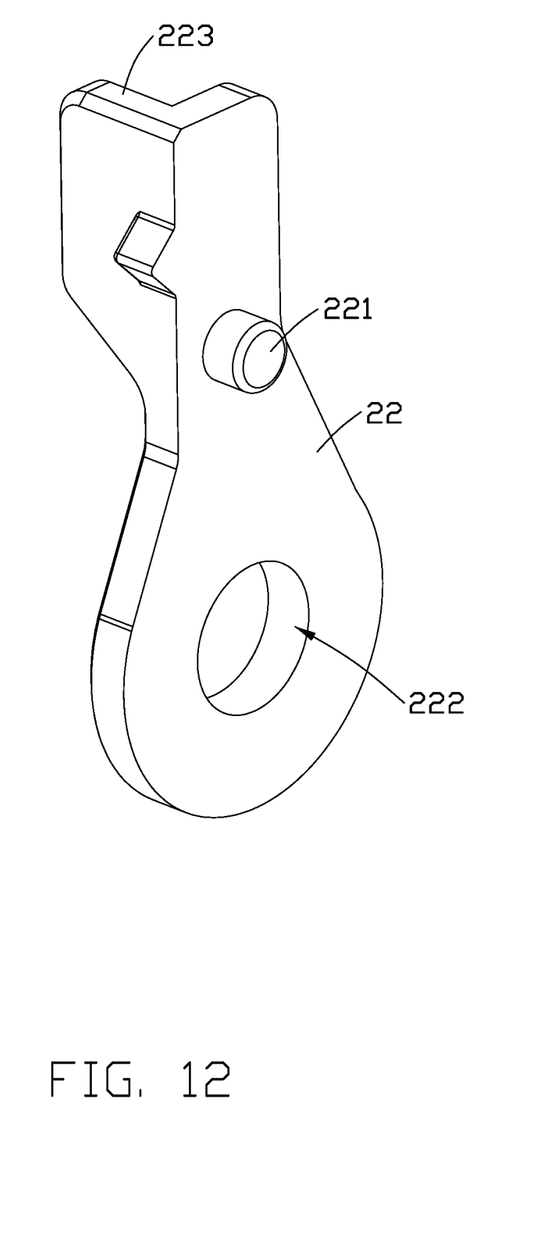
FIG. 12 is another isometric view illustrating the unlocking piece in FIG. 11.

In some embodiments, unlocking piece 22 further includes a hole 222. A part of the fixing piece 24 passes through the hole 222 and the second groove 213 and connects the first wall 171, so the unlocking piece 22 can rotate around the axis of hole 222, which improves the assembly efficiency, limits the relative movement between the unlocking piece 22 and the positioning piece 21, and reduces the number of connecting pieces between the unlocking piece 22 and the positioning piece 21.

In some embodiments, the unlocking piece 22 further includes a first handle 223. The first handle 223 can rotate the convex part 221, making the convex part 221 move from the first end 2121 to the second end 2122, and making the positioning piece 21 move along the second direction Y, so that the positioning module 20 switches from the locked state to the unlocked state. It is convenient for the user to rotate the unlocking piece 22 to unlock the expansion card 200, which improves the unlocking efficiency.

In some embodiments, the first handle 223 and the convex part 221 are respectively located on both sides of the unlocking piece 22 along the third direction Z. The first handle 223 is extended in a direction away from the first wall 171, making it convenient for the user to hold the first handle 223.

In some embodiments, the positioning piece 21 is made of metal material, which improves the structural strength and rigidity of the positioning piece 21 and reduces the risk of damage and deformation of the positioning piece 21.

In some embodiments, the positioning piece 21 is formed by melting and solidifying the metal material, which improves the manufacturing efficiency of the positioning piece 21.

In some embodiments, the positioning piece 21 is made of plastic material. The plastic material is melted and solidified by injection molding equipment, which improves the manufacturing efficiency of the positioning piece 21, and reduces the weight of the positioning piece 21, and reduces the impact of its weight on the server 1000.

In some embodiments, the unlocking piece 22 is made of metal, which improves the structural strength and rigidity of the unlocking piece 22 and reduces the risk of damage and deformation of the unlocking piece 22.

In some embodiments, the unlocking piece 22 is formed by melting and solidifying the metal material, which improves the manufacturing efficiency of the unlocking piece 22.

In some embodiments, the unlocking piece 22 is made of plastic material. The plastic material is melted and solidified by injection molding equipment, which improves the manufacturing efficiency of the unlocking piece 22, and reduces the weight of the unlocking piece 22, and reduces the impact of its weight on the server 1000.

As shown in FIG. 5, FIG. 7, FIG. 10, and FIG. 13, in some embodiments, the cabinet 100 further includes a slider 30. The slider 30 is placed in the cavity 17 and is connected to the first wall 171. The slider 30 is used to connect the side rib 2001 to support the expansion card 200, and guide the expansion card 200 to slide into the cavity 17 along the first direction X or slide out of cavity 17 in the opposite direction of the first direction X.

In some embodiments, there are two sliders 30. The two sliders 30 are arranged in the cavity 17 along the third direction Z and are connected to the first wall 171 and the second wall 172 respectively. The two sliders 30 can support the side ribs 2001 on both sides of the expansion card 200, which improves the stability and reliability of the expansion card 200 relative to the cavity 17.

In some embodiments, the slider 30 has a third groove 31, and the third groove 31 extends along the first direction X. A part of the side rib 2001 is placed in the third groove 31 and is movable along the third groove 31, which improves the sliding stability of the expansion card 200 relative to the cavity 17 and limits the movement of the expansion card 200 along the second direction Y and the opposite direction of the second direction Y and improves the seismic performance of the server 1000.

In some embodiments, the slider 30 has an opening 32 which is connected to the third groove 31. In the second direction Y, the projection of the latching part 211 is located within the projection of the opening 32.

Figure 5:
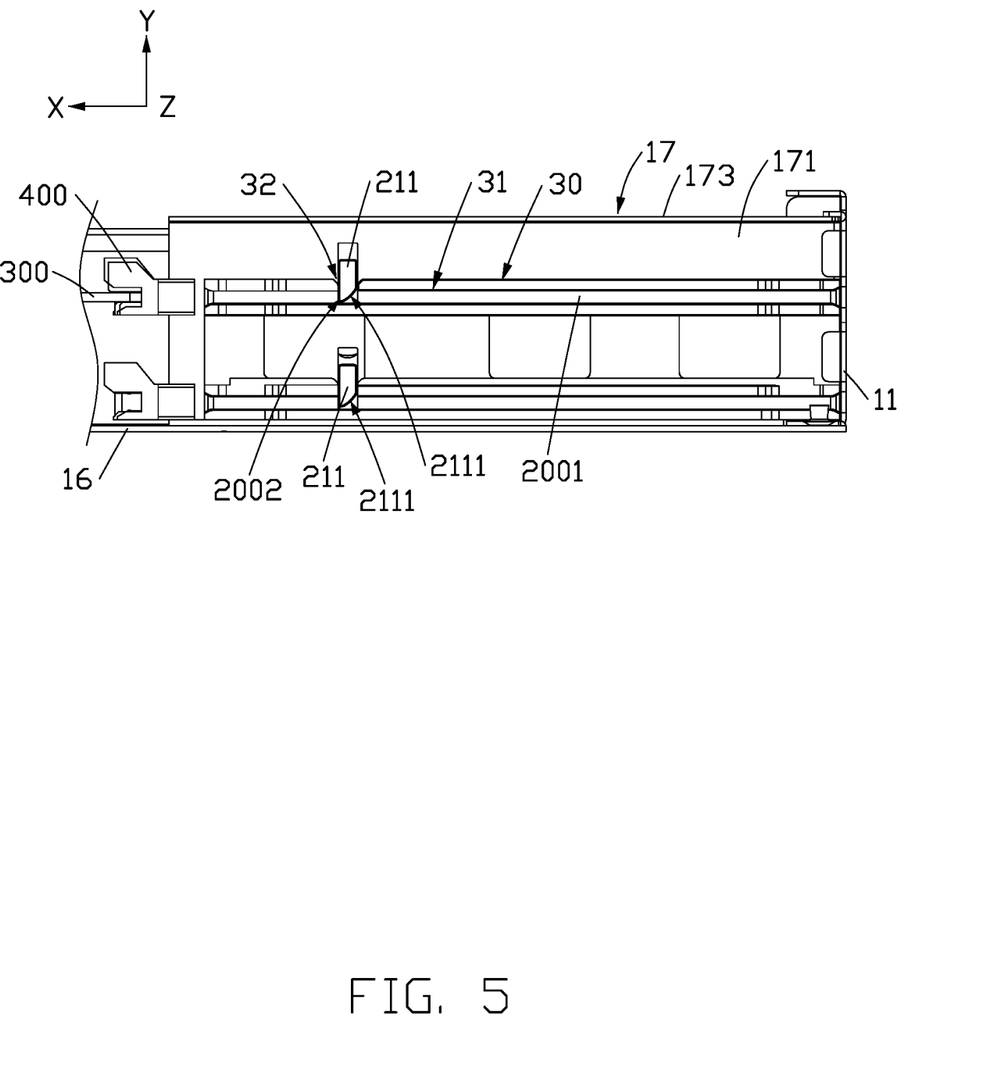
FIG. 5 is a side view illustrating an inner structure of the server in FIG. 4 when the positioning module is in the locked state.
Figure 6:
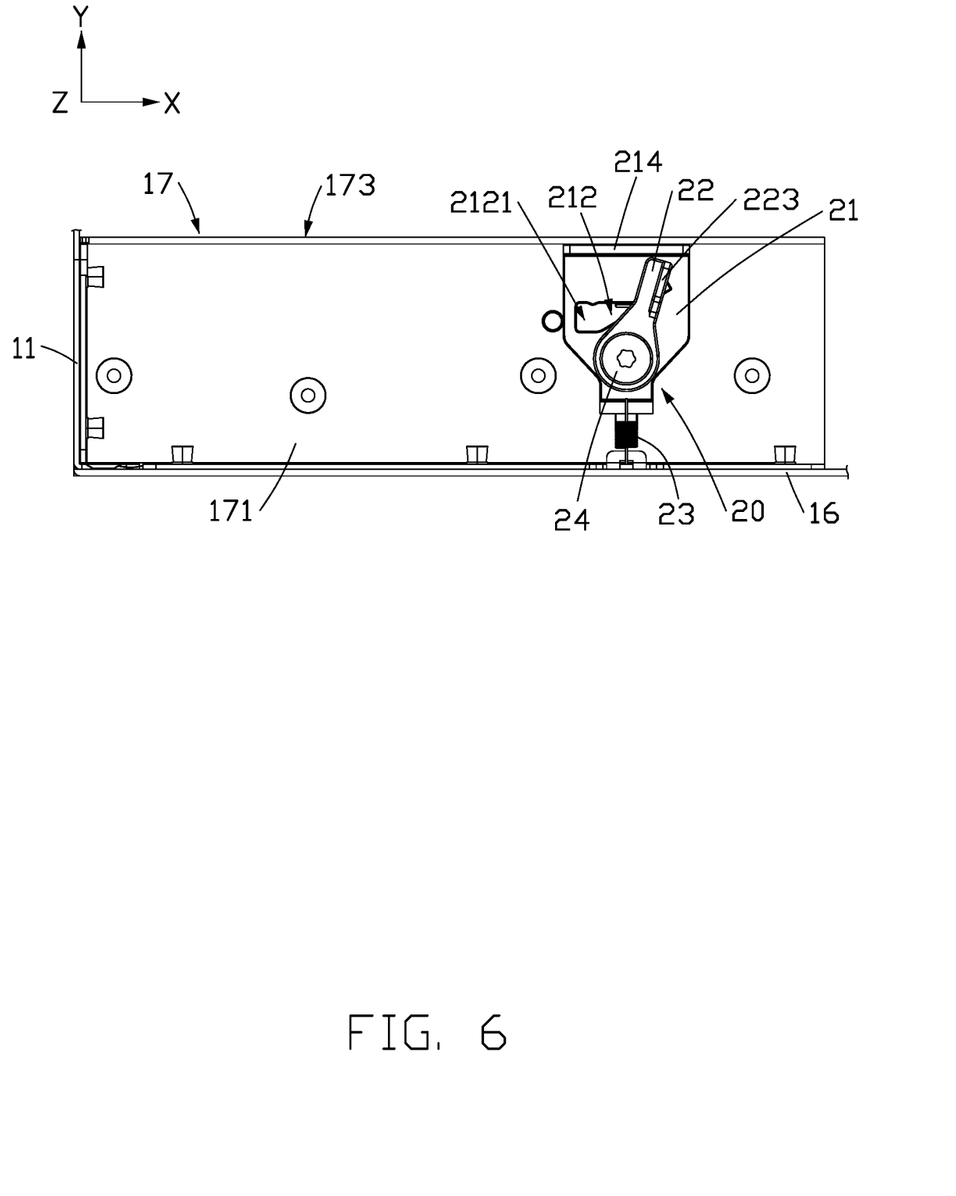
FIG. 6 is a side view illustrating the server in FIG. 3 when the positioning module is in an unlocked state.
Figure 7:
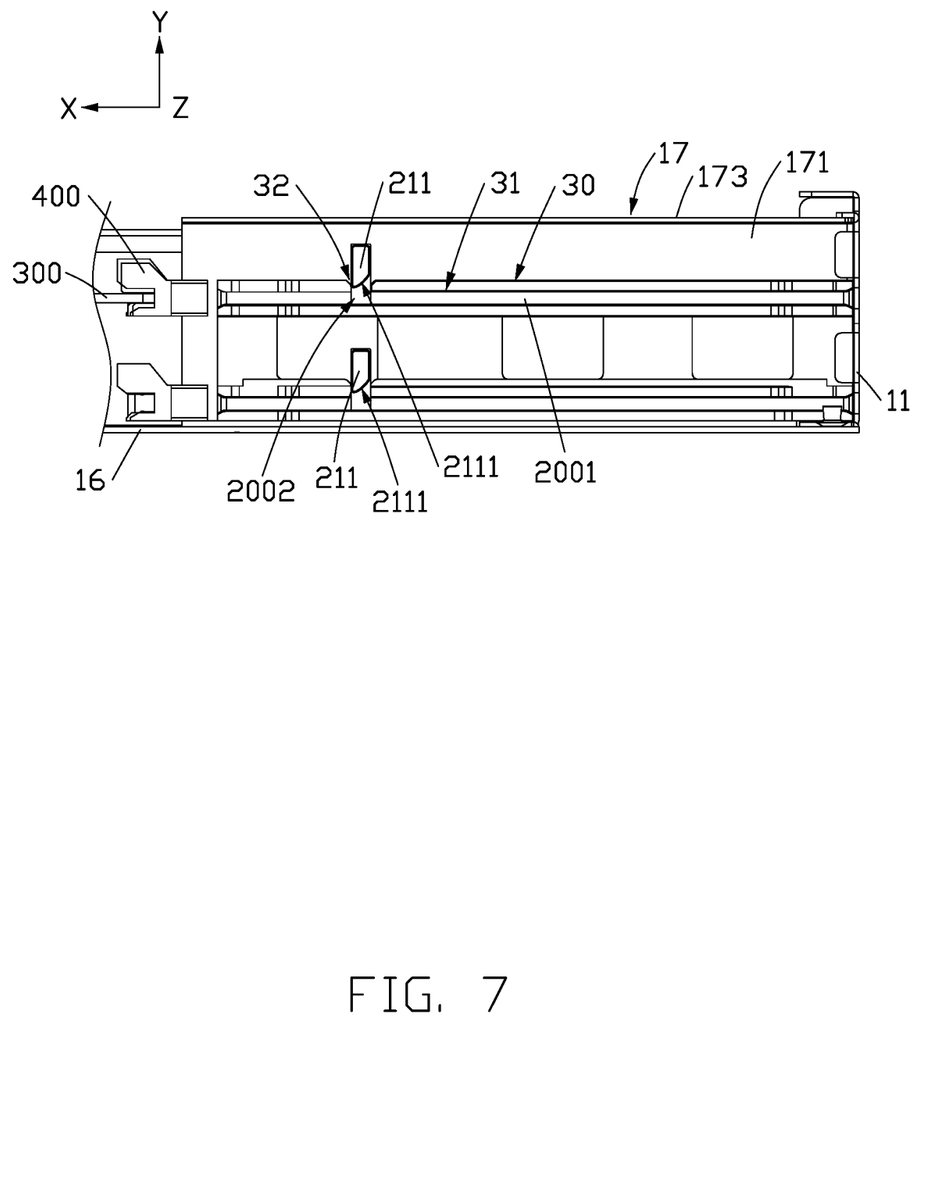
FIG. 7 is a side view illustrating an inner structure of the server in FIG. 6 when the positioning module is in the unlocked state.
Figure 13:
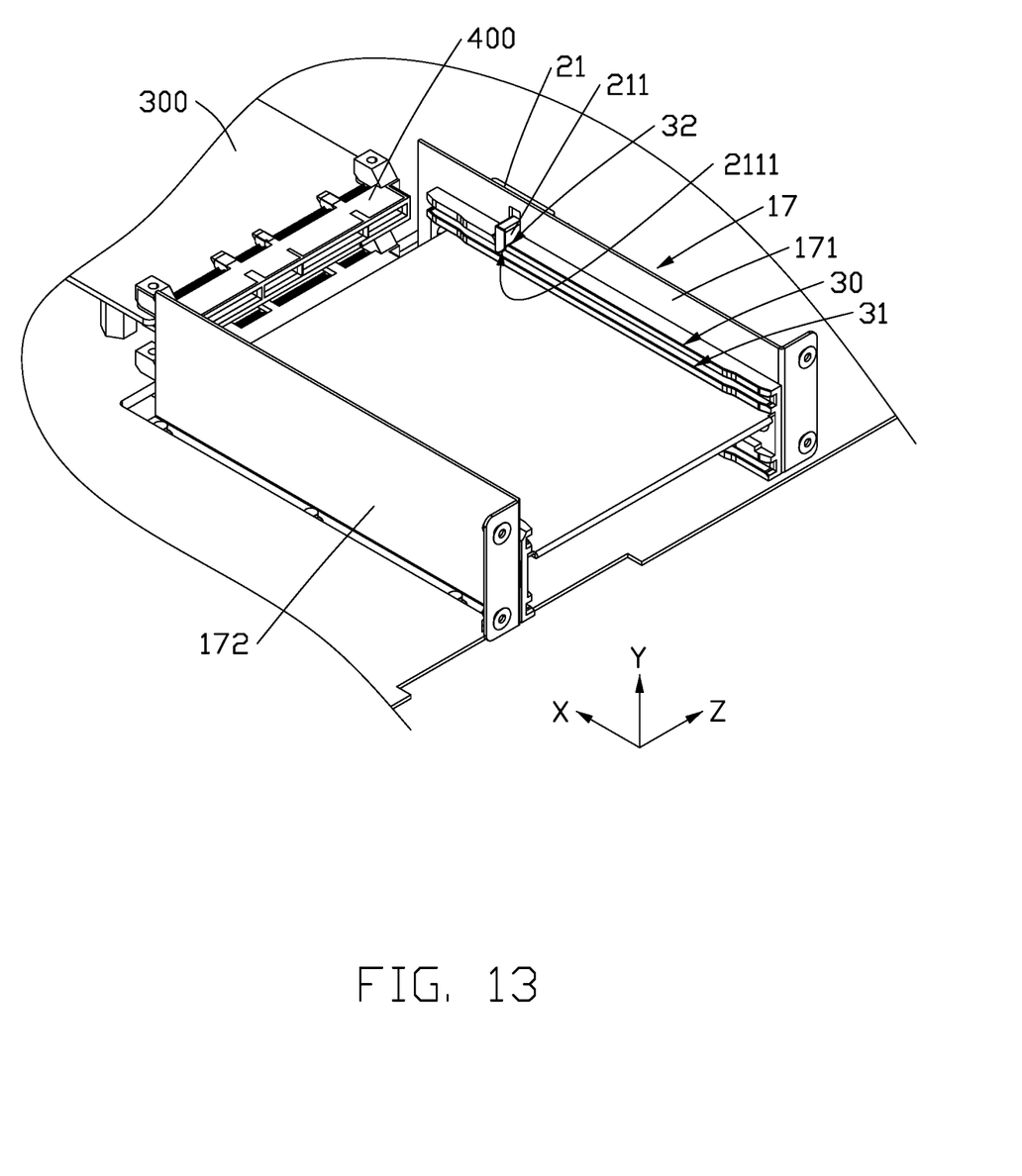
FIG. 13 is an isometric view illustrating an inner structure of the server in FIG. 1 when the expansion card in not inserted into the server.

As shown in FIG. 5, FIG. 7, and FIG. 13, when the side rib 2001 of the expansion card 200 is not connected to the latching part 211, a part of the latching part 211 extends into the third groove 31 through the opening 32, and a part of the bevel 2111 extends into the third groove 31 through the opening 32 and is located on a movement path of the side rib 2001 along the first direction X.

In some embodiments, when the side rib 2001 is inserted into the third groove 31, the slot 2002 is placed in the third groove 31, which facilitates the insertion of the latching part 211 and the slot 2002.

In some embodiments, when the expansion card 200 is located at a pre-set position in the cavity 17, along the second direction Y, the projection of the slot 2002 overlaps with the projection of the opening 32, and the latching part 211 can be plugged into the slot 2002 through the opening 32.

In some embodiments, when the latching part 211 is plugged into the slot 2002, the latching part 211 limits the movement of the expansion card 200 along the first direction X and the opposite direction of the first direction X, and slider 30 limits the movement of the expansion card 200 along the second direction Y and the opposite direction of second direction Y, and the two sliders 30 together limit the movement of the expansion card 200 along the third direction Z and the opposite direction of the third direction Z, to better position the expansion card 200, reducing the shaking of the expansion card 200 relative to the cabinet 100 and improving the seismic performance of the server 1000.

In some embodiments, the slider 30 has a plurality of third grooves 31, and the plurality of third grooves 31 are arranged along the second direction Y, so that the slider 30 can support and guide multiple expansion cards 200 at the same time, which improves assembly efficiency The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A cabinet configured for mounting an expansion card, the cabinet comprising:
   a base defining a cavity, wherein the cavity is configured to slidably, in a first direction, receive the expansion card; and
   a positioning module comprising a positioning piece, wherein the positioning piece is movably connected to the base in a second direction, the second direction is substantially perpendicular to the first direction, the positioning piece comprises a latching part, the latching part is placed in the cavity, the latching part comprises a bevel,
   wherein when the cavity slidably receives the expansion card, the expansion card pushes the bevel to lift the latching part, when a slot of the expansion card is aligned with the latching part, the latching part inserts into the slot to latch the expansion card, and
   when the latching part is pulled out from the slot, the latching part unlatches the expansion card.

2. The cabinet of claim 1, wherein the positioning module further comprises an elastic piece, the elastic piece is connected to each of the positioning piece and the base, the elastic piece is configured for moving the positioning piece to insert the latching part into the slot when the slot is aligned with the latching part.

3. The cabinet of claim 1, wherein the positioning piece further defines a first sliding groove, the positioning module further comprises an unlocking piece, the unlocking piece is rotatably connected to the positioning piece, the unlocking piece comprises a convex part, the convex part is partially located in the first sliding groove; when the unlocking piece is rotated, the convex part moves relative to the positioning piece in the first sliding groove, and the convex part moves the positioning piece in the second direction, to pull the latching part out from the slot.

4. The cabinet of claim 3, wherein the first sliding groove defines a first end and a second end, when the convex part is located on the first end, the latching part latches the expansion card, and when the convex part is located on the second end, the latching part unlatches the expansion card; in the second direction, a distance between the second end and a rotation axis of the unlocking piece is greater than a distance between the second end and the rotation axis.

5. The cabinet of claim 3, wherein the positioning piece further defines a second groove, the second groove extends in the second direction; the unlocking piece further defines a hole, the positioning module further comprises a fixing piece, the fixing piece extends through the hole and the second groove into the cavity, the unlocking piece rotates around the fixing piece.

6. The cabinet of claim 3, wherein the unlocking piece further comprises a first handle, the first handle is configured for moving the convex part.

7. The cabinet of claim 1, wherein the positioning piece further comprises a second handle, the second handle is configured to be moved to move the latching part.

8. The cabinet of claim 1 further comprising a slider, wherein the slider is placed in the cavity, the slider is configured for supporting the expansion card and guiding the expansion card to slide into the cavity.

9. The cabinet of claim 3, wherein the positioning module further comprises a stopping piece, the stopping piece is located on the base, when the convex part is located on the first end, the stopping piece contacts the convex part to limit the convex part from rotating.

10. The cabinet of claim 1, wherein the base comprises a first wall, a second wall, and a third wall, the first wall and the second wall are parallel to the first direction and the second direction, the third wall is connected between the first wall and the second wall, the cavity is formed between the first wall, the second wall, and the third wall.

11. A server comprising:
an expansion card; and
a cabinet configured for mounting the expansion card, the cabinet comprising:
  a base defining a cavity, wherein the expansion card is slidable into the cavity in a first direction; and
  a positioning module comprising a positioning piece, wherein the positioning piece is movably connected to the base in a second direction, the second direction is substantially perpendicular to the first direction, the positioning piece comprises a latching part, the latching part is placed in the cavity,
wherein the expansion card defines a slot, the latching part comprises a bevel, when the expansion card slides into the cavity, the expansion card pushes the bevel to lift the latching part, the latching part inserts into the slot to latch the expansion card when the slot is aligned with the latching part, and when the latching part is pulled out from the slot, the latching part unlatches the expansion card.

12. The cabinet of claim 11, wherein the positioning module further comprises an elastic piece, the elastic piece is connected to each of the positioning piece and the base, the elastic piece is configured for moving the positioning piece to insert the latching part into the slot when the slot is aligned with the latching part.

13. The cabinet of claim 11, wherein the positioning piece further defines a first sliding groove, the positioning module further comprises an unlocking piece, the unlocking piece is rotatably connected to the positioning piece, the unlocking piece comprises a convex part, the convex part is partially located in the first sliding groove; when the unlocking piece is rotated, the convex part moves relative to the positioning piece in the first sliding groove, and the convex part moves the positioning piece in the second direction, to pull the latching part out from the slot.

14. The cabinet of claim 13, wherein the first sliding groove defines a first end and a second end, when the convex part is located on the first end, the latching part latches the expansion card, and when the convex part is located on the second end, the latching part unlatches the expansion card; in the second direction, a distance between the second end and a rotation axis of the unlocking piece is greater than a distance between the second end and the rotation axis.

15. The cabinet of claim 13, wherein the positioning piece further defines a second groove, the second groove extends in the second direction; the unlocking piece further defines a hole, the positioning module further comprises a fixing piece, the fixing piece extends through the hole and the second groove into the cavity, the unlocking piece rotates around the fixing piece.

16. The cabinet of claim 13, wherein the unlocking piece further comprises a first handle, the first handle is configured for moving the convex part.

17. The cabinet of claim 11, wherein the positioning piece further comprises a second handle, the second handle is configured to be moved to move the latching part.

18. The cabinet of claim 11 further comprising a slider, wherein the slider is placed in the cavity, the slider is configured for supporting the expansion card and guiding the expansion card to slide into the cavity.

19. The cabinet of claim 13, wherein the positioning module further comprises a stopping piece, the stopping piece is located on the base, when the convex part is located on the first end, the stopping piece contacts the convex part to limit the convex part from rotating.

20. A cabinet configured for mounting an expansion card, the cabinet comprising:
  a base defining a cavity, wherein the cavity is configured to receive the expansion card in a first direction; and
  a positioning module comprising a positioning piece and an unlocking piece, wherein the positioning piece is connected to the base, outside of the cavity, and is movable in a second direction, the second direction is substantially perpendicular to the first direction, the positioning piece comprises a latching part, the latching part is placed in the cavity, the latching part comprises a bevel; the unlocking piece is connected to the base and is rotatable from a first position to a second position to move the positioning piece along the second direction,
wherein a slider is placed in the cavity, when the unlocking piece is rotated to the first position, the latching part is placed in the slider and latches the expansion card, and when the unlocking piece is rotated to the second position, the latching part unlatches the expansion card.

* * * * *